(12) United States Patent
Noda

(10) Patent No.: US 6,852,610 B2
(45) Date of Patent: Feb. 8, 2005

(54) SEMICONDUCTOR DEVICE AND METHOD FOR MANUFACTURING THE SAME

(75) Inventor: Taiji Noda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/642,655

(22) Filed: Aug. 19, 2003

(65) Prior Publication Data

US 2004/0033649 A1 Feb. 19, 2004

Related U.S. Application Data

(62) Division of application No. 09/981,806, filed on Oct. 19, 2001, now abandoned.

(30) Foreign Application Priority Data

Oct. 19, 2001 (JP) ........................................ 2000-327103

(51) Int. Cl.[7] .................. H01L 21/425; H01L 31/0376; H01L 29/76; H01L 31/94; H01L 31/119
(52) U.S. Cl. ........................ 438/549; 438/527; 438/530; 438/529; 438/531; 257/61; 257/405
(58) Field of Search ................................ 438/549, 527, 438/530, 529, 531; 257/61, 405, 282, 288

(56) References Cited

U.S. PATENT DOCUMENTS 5,602,045 A    2/1997  Kimura
6,013,546 A    1/2000  Gardner et al.
6,030,863 A    2/2000  Chang et al.
6,078,081 A    6/2000  Lee
6,087,209 A    7/2000  Yeap et al.

FOREIGN PATENT DOCUMENTS

| JP | 62-200723 | 9/1987 |
|---|---|---|
| JP | 03-174721 | 7/1991 |
| JP | 11-40801 | 2/1999 |
| JP | 2000-260728 | 9/2000 |

OTHER PUBLICATIONS

M.C. Ozturk et al., "Very shallow p$^+$-n junction formation by low-energy BF$^{+2}$ion implantation into crystalline and germanium preamorphized silicon", Appl. Phys. Lett. 52 (12), pp. 963–965, Mar. 1988.

Notice of Reasons of Rejection Dated Nov. 18, 2003.

Primary Examiner—Eddie Lee
Assistant Examiner—Samuel A Gebremariam
(74) Attorney, Agent, or Firm—Donald R. Studebaker; Nixon Peabody LLP

(57) ABSTRACT

A semiconductor device includes a gate electrode formed on a semiconductor region via a gate insulative film and an extension high concentration diffusion layer of a first conductivity type formed in the semiconductor region beside the gate electrode. A dislocation loop defect layer is formed in a region of the semiconductor region beside the gate electrode and at a position shallower than an implantation projected range of the extension high concentration diffusion layer.

10 Claims, 15 Drawing Sheets

SEMICONDUCTOR DEVICE AND METHOD FOR MANUFACTURING THE SAME

BACKGROUND OF THE INVENTION

The present invention relates to a semiconductor device capable of operating at a high speed with a low power consumption and with which it is possible to further increase the degree of integration of semiconductor integrated circuits, and a method for manufacturing the same.

With the advent of ultra high scale integration of semiconductor integrated circuits, there has been a growing demand in the art for further miniaturization of MIS transistors. A method for manufacturing an MIS transistor having a shallow junction plane is desired for realizing the further miniaturization of MIS transistors.

A conventional method for manufacturing an MIS transistor will now be described with reference to the drawings.

First, referring to FIG. 13A, arsenic (As) ion, which is an N-type impurity, and phosphorus (P) ion, for which the implantation energy and the dose are greater than those for the arsenic ion, are implanted into a semiconductor substrate 101 made of P-type silicon. Then, thermal annealing is performed so as to form an N-type well 101a in an upper portion of the semiconductor substrate 101, and an N-type channel diffusion layer 102 in an upper portion of the N-type well 101a.

Then, referring to FIG. 13B, a gate oxide film 103 having a thickness of about 2 nm is formed on the semiconductor substrate 101, and a gate electrode 104 made of polycrystalline silicon having a thickness of about 200 nm is formed on the gate oxide film 103.

Then, referring to FIG. 13C, arsenic ion is implanted so as to form a first ion implantation layer 105A, and then boron fluoride ($BF_2$) ion, which is a P-type impurity, is implanted at a lower energy and a higher dose than those for the arsenic ion so as to form a second ion implantation layer 106A.

Then, referring to FIG. 14A, an insulative film of silicon nitride, or the like, is deposited to a thickness of about 50 nm on the semiconductor substrate 101, and then a side wall 107 is formed from the deposited insulative film by selective etching having a strong anisotropy in a direction perpendicular to the substrate plane.

Then, referring to FIG. 14B, boron fluoride is implanted into the semiconductor substrate 101 using the gate electrode 104 and the side wall 107 as a mask, and then thermal annealing is performed at a high temperature for a short period of time so as to form a P-type extension high concentration diffusion layer 106 from the second ion implantation layer 106A in a region of the semiconductor substrate 101 under the side wall 107, and a pocket diffusion layer 105 from the first ion implantation layer 105A in a region under the P-type extension high concentration diffusion layer 106. At the same time, an N-type high concentration diffusion layer 108 is formed in a region beside the side wall 107.

As described above, boron fluoride ($BF_2$) is used instead of boron (B) for the formation of the P-type extension high concentration diffusion layer 106. It is possible to reduce the effective implantation projected range of boron by the difference in mass between boron and boron fluoride, thereby shallowing the junction of the P-type extension high concentration diffusion layer 106.

With the conventional method for manufacturing an MIS transistor, however, a so-called "dose loss phenomenon" occurs, in which boron atoms forming the P-type extension high concentration diffusion layer 106 are lost through the surface of the semiconductor substrate 101. Due to the dose loss phenomenon, the P-type impurity concentration in the semiconductor substrate 101 after the thermal annealing is reduced, thereby reducing the drivability of the transistor.

SUMMARY OF THE INVENTION

The present invention has been made to solve the problems in the prior art, and has an object to realize miniaturization of semiconductor devices without lowering the drivability thereof, by suppressing the dose loss phenomenon after impurity ion implantation.

The present inventor has reached the following conclusion as a result of conducting various studies on the boron dose loss phenomenon when boron fluoride is used as a P-type dopant.

Annealing that is performed for forming the side wall 107 after boron fluoride is implanted into the N-type well 101a, i.e., annealing that is performed at a relatively low temperature of about 680° C. to about 850° C. for a long period of time, causes transient enhanced diffusion (hereinafter abbreviated as "TED") of boron occurs, thereby deepening the junction plane, while fluorine of boron fluoride increases the dose loss of boron. Due to the dose loss phenomenon, the boron concentration in the semiconductor substrate 101 substantially decreases. Note that TED refers to a phenomenon in which impurity ion diffuses through an interaction between excessive point defects existing in crystal lattices and the implanted impurity ion, whereby the impurity ion diffuses while being accelerated beyond its diffusion coefficient in thermal equilibrium.

Another problem is that the dose loss increases as the boron fluoride implantation energy is reduced in an attempt to obtain a shallow junction. It is believed that this occurs as follows. As the implantation energy is reduced, the implantation projected range decreases, thereby shortening the distance between the position at which the concentration of the implanted atoms peaks and the surface of the semiconductor substrate 101. Therefore, the flux of boron atoms toward the surface increases, thereby causing a so-called "surface proximity effect".

Particularly, when boron fluoride is used, a high concentration of fluorine atoms is present in the semiconductor substrate 101, and fluorine diffuses to surface very rapidly. Therefore, the flux of fluorine toward the substrate surface is further increased, and the surface diffusion of fluorine increases the dose loss of impurity atoms, particularly boron. For example, the dose loss phenomenon of boron after boron fluoride implantation is significant at a low implantation energy of 20 keV or less.

Conversely, when the dose is increased in order to increase the boron concentration in the semiconductor substrate 101 after thermal annealing, an extra crystal damage is given to the semiconductor substrate 101, thereby increasing TED of boron atoms.

A method for forming a dislocation loop defect layer, thereby suppressing TED, is disclosed in, for example, Japanese Laid-Open Patent Publication No. 11-40801. This publication discloses forming a dislocation loop defect layer by turning the semiconductor substrate 101 into an amorphous state by using at least one ion species selected from $XY_n^+$ type ions (where X is a group IV element, Y is a group VII element, and n=1, 2, 3), and then performing thermal annealing.

However, while the publication states that the element Y is preferably fluorine, it is believed that fluorine would increase the dose loss. Moreover, while the publication states that an LDD diffusion layer is formed through solid phase diffusion from a gate side wall made of an insulative film, it is believed that with solid phase diffusion, the concentration would be insufficient for forming an extension diffusion layer having a high concentration that is required for miniaturized semiconductor devices.

Moreover, the present inventor has reached the following conclusion as a result of conducting various studies on the possible reasons why TED of boron occurs and why the activation ratio is low even in a case where the junction of a P-type diffusion layer is shallowed by using boron ion ($B^+$) with an acceleration energy being reduced to be lower than that for boron fluoride.

When a large dose of boron of about $3 \times 10^{14}/cm^2$ is implanted into an N-type well at a low energy of about 2 keV, for example, and then a side wall is formed by performing annealing at a low temperature of about 680° C. to about 800° C. and for a long period of time, TED of implanted boron occurs, thereby deepening the junction. Since boron is implanted at a relatively high dose, a high concentration portion created in the vicinity of the implantation projected range at the time of ion implantation is clustered as it is, as illustrated in FIG. 15, thereby substantially decreasing the boron activation concentration. It is believed that the clustering is caused by the interaction between boron and excessive interstitial silicon, which leads to formation of boron-interstitial clusters (BICs).

According to the present invention, which has been made based on the various studies described above, a dislocation loop defect layer is intentionally provided at a position shallower than the implantation projected range of impurity ion for forming an extension high concentration diffusion layer.

Specifically, a semiconductor device of the present invention includes: a gate electrode formed on a semiconductor region via a gate insulative film; an extension high concentration diffusion layer of a first conductivity type formed in the semiconductor region beside the gate electrode; and a dislocation loop defect layer formed in a region of the semiconductor region beside the gate electrode and at a position shallower than an implantation projected range of the extension high concentration diffusion layer.

In the semiconductor device of the present invention, the dislocation loop defect layer is formed at a position shallower than the implantation projected range of the extension high concentration diffusion layer. Therefore, during the thermal annealing, impurity atoms diffusing from the extension high concentration diffusion layer toward the surface of the substrate are captured by the dislocation loop defect layer. In this way, the dose loss phenomenon in the extension high concentration diffusion layer is suppressed, whereby it is possible to realize miniaturization while maintaining a sufficient drivability as a semiconductor device. Moreover, since the dislocation loop defect layer provided at a position shallower than the implantation projected range of the extension high concentration diffusion layer is spaced apart from the junction plane of the extension high concentration diffusion layer, junction leak due to the dislocation loop defect layer can also be suppressed.

It is preferred that the semiconductor device of the present invention further includes a pocket diffusion layer of a second conductivity type formed under the extension high concentration diffusion layer. In this way, a depletion layer is prevented from spreading in the channel region by the PN junction between the extension high concentration diffusion layer and the underlying pocket diffusion layer, whereby it is possible to suppress manifestation of the short channel effect.

In the semiconductor device of the present invention, it is preferred that fluorine is segregated in the dislocation loop defect layer. In a case where the extension high concentration diffusion layer is formed with a shallow junction, it is preferred to use boron fluoride instead of boron, and the segregation of fluorine, occurring as a result of the fluorine atoms of boron fluoride being captured by the dislocation loop defect layer, indicates that the dose loss phenomenon of boron is suppressed. The phenomenon in which implanted fluorine ion is segregated in defect portions is described in articles including M. C. Ozturk, J. J. Worttman, and R. B. Fair, Appl. Phys. Lett., 52, 963 (1988).

It is preferred that the semiconductor device of the present invention further includes: a side wall formed on a side surface of the gate electrode on the semiconductor region; and a high concentration diffusion layer of the first conductivity type formed in the semiconductor region beside the side wall so as to be in contact with an outer side of the extension high concentration diffusion layer, the high concentration diffusion layer of the first conductivity type having a junction plane at a place deeper than the extension high concentration diffusion layer. In this way, the semiconductor device can be provided as a miniaturized MIS transistor.

A method for manufacturing a semiconductor device of the present invention includes: a first step of forming a gate electrode on a semiconductor region via a gate insulative film; a second step of forming an amorphous layer in an upper portion of the semiconductor region by implanting ion of a group IV element into the semiconductor region using the gate electrode as a mask; a third step of implanting a first impurity of a first conductivity type into the semiconductor region using the gate electrode as a mask with an implantation projected range such that the first impurity reaches a position deeper than the amorphous layer; and a fourth step of subjecting the semiconductor region to thermal annealing so as to form an extension high concentration diffusion layer of the first conductivity type through diffusion of the first impurity, the extension high concentration diffusion layer having a junction at a position deeper than the amorphous layer.

According to the method for manufacturing a semiconductor device of the present invention, the first impurity of the first conductivity type is implanted into the semiconductor region with an implantation projected range such that the first impurity reaches a position deeper than the amorphous layer. Through the following thermal annealing, the dislocation loop defect layer is formed in the semiconductor region on the crystal layer side of the interface between the amorphous layer and the crystal layer (the amorphous/crystal interface; hereinafter referred to as the "a/c interface"). The dislocation loop defect layer is where interstitial atoms and impurity atoms are captured. Therefore, the flux of impurity atoms toward the surface side of the semiconductor region is suppressed. Thus, the dose loss in the extension high concentration diffusion layer is reduced, whereby it is possible to realize a semiconductor device that can be miniaturized without lowering the drivability of the device.

In the method for manufacturing a semiconductor device of the present invention, it is preferred that: the third step includes a step of implanting a second impurity of a second conductivity type into the semiconductor region using the gate electrode as a mask with an implantation projected range such that the second impurity reaches a position deeper than the amorphous layer; and the fourth step includes a step of forming a pocket diffusion layer of the second conductivity type through diffusion of the second impurity under the extension high concentration diffusion layer.

It is preferred that the method for manufacturing a semiconductor device of the present invention further includes, after the fourth step: a step of forming a side wall made of an insulative film on a side surface of the gate electrode; and a step of implanting a third impurity of the first conductivity type into the semiconductor region using the gate electrode and the side wall as a mask, and then performing thermal annealing, so as to form a high concentration diffusion layer of the first conductivity type through diffusion of the third impurity, the high concentration diffusion layer of the first conductivity type being located on an outer side of the extension high concentration diffusion layer and having a junction plane at a position deeper than the extension high concentration diffusion layer. In this way, it is possible to realize a miniaturized MIS transistor.

In the method for manufacturing a semiconductor device of the present invention, it is preferred that the group IV element is silicon or germanium. In this way, the a/c interface can reliably be formed at a position shallower than the junction plane of the extension high concentration diffusion layer. In addition, a group IV element is electrically neutral. Moreover, where the semiconductor region is made of silicon, it is preferred to turn the semiconductor region into an amorphous state using silicon so that the atom at a lattice position and the interstitial atom are the same atom.

In the method for manufacturing a semiconductor device of the present invention, it is preferred that the second step includes implanting ion of the group IV element at a dose equal to or greater than a dose such that the semiconductor region is turned into an amorphous state. In this way, it is possible to uniformly form the a/c interface at a position shallower than the junction plane of the extension high concentration diffusion layer.

In the method for manufacturing a semiconductor device of the present invention, it is preferred that the third step includes implanting the second impurity with an implantation projected range of about 14 nm or less. Thus, the second impurity can be implanted at a low energy so as to provide a shallow junction, and the dose loss phenomenon in the extension high concentration diffusion layer can still be suppressed by the dislocation loop defect layer. Therefore, it is possible to reliably locate the junction plane of the extension high concentration diffusion layer at a shallow position.

In the method for manufacturing a semiconductor device of the present invention, it is preferred that the second impurity is a molecule containing boron fluoride or fluorine. In this way, since the fluorine atoms are likely to be captured by the dislocation loop defect layer, a strong flux of fluorine atoms toward the surface side of the semiconductor region can be reduced, whereby it is possible to reliably prevent the dose loss phenomenon of P-type impurity ion such as boron ion.

In the method for manufacturing a semiconductor device of the present invention, it is alternatively preferred that the second impurity is boron. In this way, since interstitial atoms are captured by the dislocation loop defect layer, the production of BICs can be suppressed, whereby it is possible to reliably improve the activation ratio of P-type impurity ion such as boron ion.

In the method for manufacturing a semiconductor device of the present invention, it is preferred that the third step includes a step of performing a plurality of iterations of ion implantation of the first impurity each at a dose less than or equal to a dose such that the semiconductor region is turned into an amorphous state, each of the iterations of ion implantation being followed by thermal annealing so as to restore a crystallinity of the semiconductor region. In this way, it is possible to prevent the a/c interface from moving deeper from the surface. In addition, the implantation damage occurring when implanting the first impurity for forming the extension high concentration diffusion layer is reduced, thereby suppressing TED due to the first impurity.

It is preferred that the method for manufacturing a semiconductor device of the present invention further includes, between the first step and the third step, a step of forming an insulative film on the semiconductor region so as to cover an exposed portion of the semiconductor region. In this way, it is possible to further suppress the dose loss phenomenon of the first impurity for forming the extension high concentration diffusion layer.

DETAILED DESCRIPTION OF THE INVENTION

First Embodiment

A first embodiment of the present invention will be described with reference to the drawings.

Figure 1:
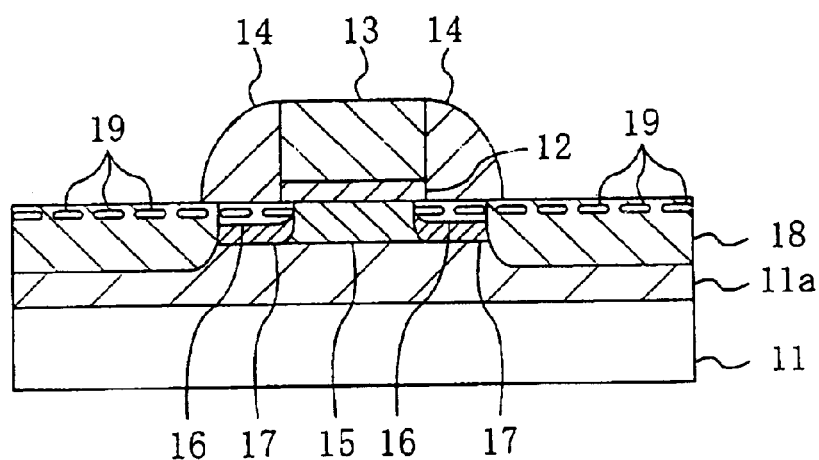
FIG. 1 is a cross-sectional view illustrating an MIS transistor according to a first embodiment of the present invention.

FIG. 1 is a cross-sectional view illustrating an MIS transistor according to the first embodiment of the present invention.

As illustrated in FIG. 1, an N-type well 11a is formed in an upper portion of a semiconductor substrate 11 made of P-type silicon, for example. Note that while the transistor of the present embodiment is formed in and on the N-type well 11a, the N-type well 11a may alternatively an N-type semiconductor layer provided in a substrate having an SOI structure, or an N-type semiconductor substrate may alternatively be used.

A gate electrode 13 made of poly-metal or polysilicon is selectively formed on the N-type well 11a via a gate insulative film 12 made of silicon oxide, or the like. A side wall 14 made of silicon nitride or silicon oxide is formed on a side surface of the gate electrode 13.

An N-type channel diffusion layer 15 is formed in a region of the N-type well 11a below the gate electrode 13. A P-type extension high concentration diffusion layer 16 is formed in a region below each side wall 14. An N-type pocket diffusion layer 17 is formed under the P-type extension high concentration diffusion layer 16.

A P-type high concentration diffusion layer 18 is formed in a region of the N-type well 11a beside the side wall 14 so as to be in contact with the outer side of the P-type extension high concentration diffusion layer 16. The P-type high concentration diffusion layer 18 is to be a source-drain diffusion layer having a junction plane at a position deeper than the P-type extension high concentration diffusion layer 16.

A feature of the first embodiment is a dislocation loop defect layer 19 provided in a region of the N-type well 11a beside the gate electrode 13 and at a position shallower than the implantation projected range for the impurity ion of the P-type extension high concentration diffusion layer 16.

Because of the dislocation loop defect layer 19 provided at a shallow position beside the gate electrode 13, the dose loss, particularly that of impurity atoms forming the P-type extension high concentration diffusion layer 16, is suppressed. Therefore, it is possible to suppress a decrease in the drivability of the transistor and to realize an MIS transistor having a short gate length.

A method for manufacturing an MIS transistor having such a structure will now be described with reference to the drawings.

FIG. 2A to FIG. 2D, FIG. 3A and FIG. 3B are cross-sectional views sequentially illustrating steps in a method for manufacturing the MIS transistor according to the first embodiment of the present invention.

Figure 2A:
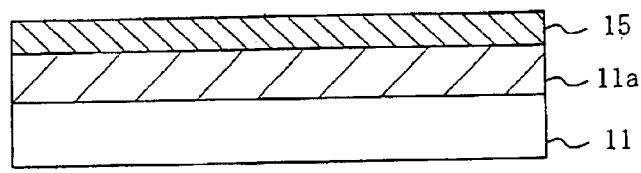
FIG. 2A to FIG. 2D are cross-sectional views sequentially illustrating steps in a method for manufacturing the MIS transistor according to the first embodiment of the present invention.

First, referring to FIG. 2A, the semiconductor substrate 11 made of P-type silicon is subjected to ion implantation at an implantation energy of about 140 keV and a dose of about $1 \times 10^{12}/cm^2$ by using N-type impurity ion, e.g., arsenic (As) ion. Then, using N-type impurity ion, e.g., phosphorus (P) ion, ion implantation at an implantation energy of about 260 keV and a dose of about $4 \times 10^{12}/cm^2$ is performed, and further ion implantation at an implantation energy of about 540 keV and a dose of about $1 \times 10^{13}/cm^2$ is performed. Following the ion implantation, so-called "rapid thermal annealing" is performed, in which the intermediate product is heated to a high temperature of about 900° C. to about 1025° C. at a heating rate of about 100° C./sec and then held at the high temperature for about 1 second to about 10 seconds, thereby forming the N-type well 11a through diffusion of phosphorus ion in an upper portion of the semiconductor substrate 11, and the N-type channel diffusion layer 15 through diffusion of arsenic ion in an upper portion of the N-type well 11a. While arsenic ion is used herein for the N-type channel diffusion layer 15, antimony or a mixture of arsenic and antimony may alternatively be used. Note that the order in which arsenic ion and phosphorus ion are implanted is not critical.

Figure 2B:
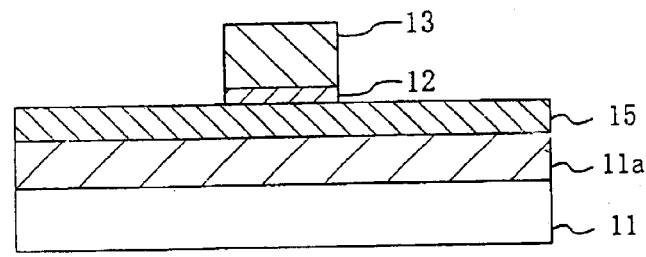

Then, referring to FIG. 2B, the gate insulative film 12 made of a thermal oxide film, or the like, and having a thickness of about 2.2 nm is formed. Then, a polycrystalline silicon film having a thickness of about 250 nm is deposited by CVD, or the like, on the gate oxide film 12, and then the gate electrode 13 is formed from the deposited polycrystalline silicon film by using photolithography and etching. The gate electrode 13 may have a poly-metal gate structure obtained by depositing a metal film on polycrystalline silicon.

Figure 2C:
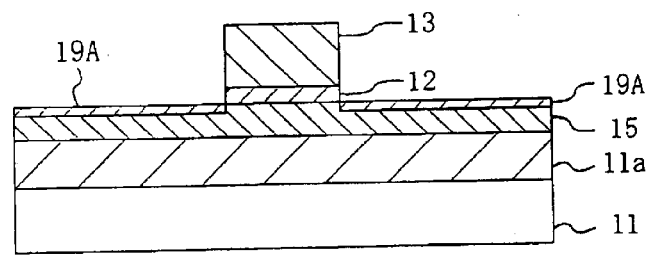

Then, referring to FIG. 2C, the N-type well 11a is subjected to ion implantation at an implantation energy of about 6 keV and a dose of about $1 \times 10^{15}/cm^2$ by using a group IV element, e.g., silicon (Si), and using the gate electrode 13 as a mask, thereby forming an amorphous layer 19A of silicon having a junction plane at a very shallow position in an upper portion of the N-type channel diffusion layer 15. Germanium (Ge) may be used instead of silicon as the group IV element forming the amorphous layer 19A. The group IV elements are preferred because they are electrically neutral.

Figure 2D:
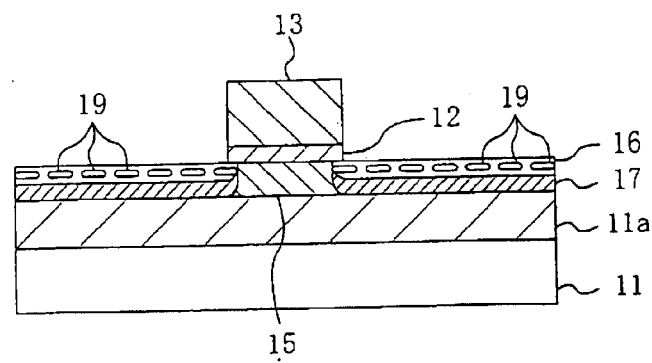

Then, referring to FIG. 2D, the N-type well 11a is subjected to ion implantation at an implantation energy of about 130 keV and a dose of about $7 \times 10^{13}/cm^2$ by using N-type impurity ion, e.g., arsenic ion, and using the gate electrode 13 again as a mask. Then, further ion implantation is performed at an implantation energy of about 10 keV and a dose of about $3 \times 10^{14}/cm^2$ by using P-type impurity ion, e.g., boron fluoride ($BF_2$) ion. The implantation projected range of boron fluoride ion is preferably about 14 nm or less. Following the ion implantation, rapid thermal annealing is performed, in which the intermediate product is heated to a high temperature of about 900° C. to about 1050° C. at a heating rate of about 100° C./sec and then held at the high temperature for up to about 10 seconds, thereby forming the dislocation loop defect layer 19 in the N-type well 11a below the a/c interface of the amorphous layer 19A. At the same time, boron ion diffuses, thereby forming the P-type extension high concentration diffusion layer 16 having a junction plane at a position deeper than the dislocation loop defect layer 19, and arsenic ion diffuses, thereby forming the N-type pocket diffusion layer 17 under the high concentration diffusion layer 16. The order in which arsenic ion and boron fluoride ion are implanted is not critical.

Moreover, the implantation of arsenic ion may be optional, and therefore the provision of the N-type pocket diffusion layer 17 may be optional. Furthermore, the rapid thermal annealing in this step may be omitted.

Figure 3A:
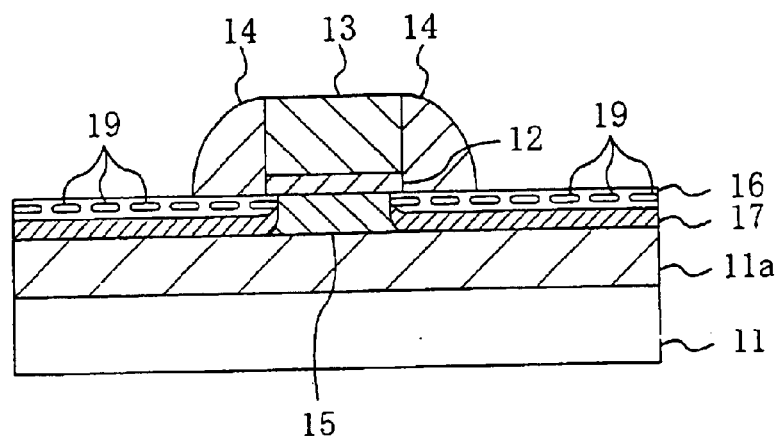
FIG. 3A and FIG. 3B are cross-sectional views sequentially illustrating steps in the method for manufacturing the MIS transistor according to the first embodiment of the present invention.

Then, referring to FIG. 3A, an insulative film made of silicon nitride having a thickness of about 50 nm, for example, is deposited by CVD, or the like, across the entire surface of the semiconductor substrate 11 including the gate electrode 13, and then the deposited insulative film is subjected to selective etching having a strong anisotropy in a direction perpendicular to the substrate plane, thereby forming the side wall 14 made of the insulative film on the side surface of the gate electrode 13.

Figure 3B:
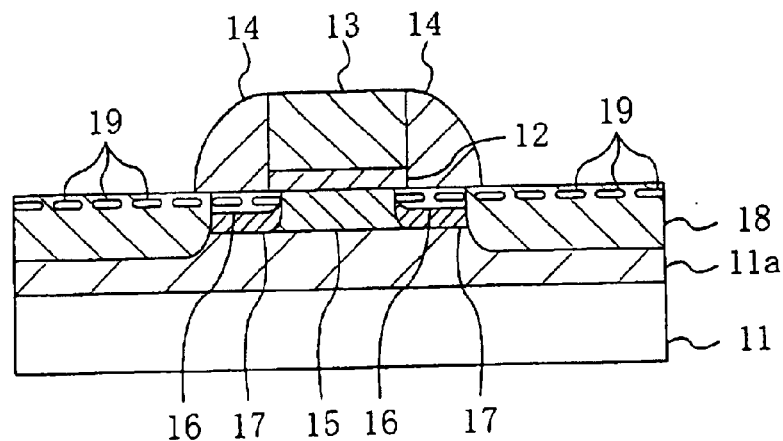

Then, referring to FIG. 3B, the N-type well 11a is subjected to ion implantation at an implantation energy of about 30 keV and a dose of about $3 \times 10^{15}/cm^2$ by using P-type impurity ion, e.g., boron fluoride ion, and using the gate electrode 13 and the side wall 14 as a mask. Following the ion implantation, rapid thermal annealing is performed, in which the intermediate product is heated to a high temperature of about 1000° C. to about 1050° C. at a heating rate of about 100° C./sec and then held at the high temperature for up to about 10 seconds, thereby forming the P-type high concentration diffusion layer 18 in a source-drain formation region on the outer side of the P-type extension high concentration diffusion layer 16. The P-type high concentration diffusion layer 18 is formed through diffusion of boron ion and has a junction plane at a position deeper than the P-type extension high concentration diffusion layer 16.

Note that it is preferred that the exposed surface of the semiconductor substrate 11 is covered by an insulative film before the rapid thermal annealing is performed in the step of FIG. 2D and after the formation of the gate electrode 13. In this way, it is possible to more reliably prevent the dose loss of boron ion. Specifically, a silicon nitride film having a thickness of about 2 nm, for example, is deposited by low pressure CVD, or the like, and then boron fluoride ion is implanted via the silicon nitride film. Note that the silicon nitride film is preferably removed after the thermal annealing.

The function of the amorphous layer 19A illustrated in FIG. 2C and that of the dislocation loop defect layer 19 illustrated in FIG. 2D will now be described.

A feature of the first embodiment is in that before the implantation of boron fluoride for forming the P-type extension high concentration diffusion layer 16, silicon ion is implanted at a low energy and a high dose, followed by thermal annealing, as illustrated in FIG. 2C, thereby forming the dislocation loop defect layer 19 at a very shallow position, as illustrated in FIG. 2D.

Figure 4:
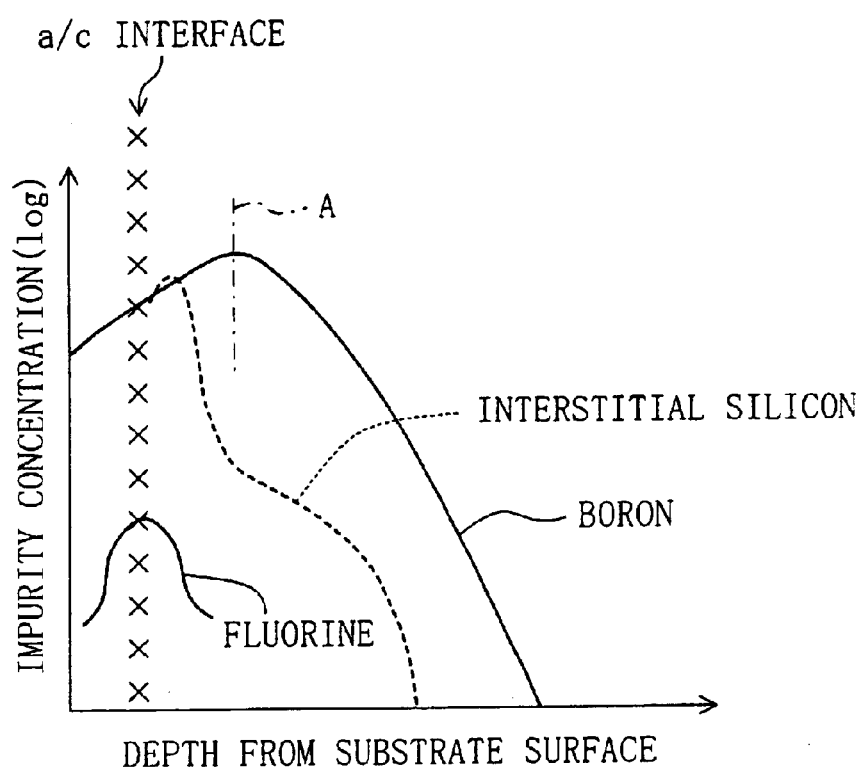
FIG. 4 is a graph illustrating the relationship between the depth from the substrate surface and the impurity concentration for each of boron, fluorine and interstitial silicon, along with an a/c interface created by an amorphous layer, in the MIS transistor according to the first embodiment of the present invention.

FIG. 4 illustrates the a/c interface created by the amorphous layer 19A, the impurity concentration distribution of boron ion and that of interstitial silicon immediately after implantation, and the impurity concentration distribution of fluorine ion after annealing. In FIG. 4, the horizontal axis of the graph represents the depth from the substrate surface, and the vertical axis represents the logarithmic value of the impurity concentration.

As illustrated in FIG. 4, boron ion for forming the P-type extension high concentration diffusion layer 16 is implanted so as to have the impurity concentration peak A at a position deeper than the a/c interface created by the amorphous layer 19A. In this way, the impurity concentration of interstitial silicon peaks on the crystal layer side (deeper side) of the a/c interface near the a/c interface. Thus, the impurity concentration peak is located between the a/c interface and the impurity concentration peak A of boron ion. As a result, the a/c interface is not located in the so-called "tail portion" of the impurity concentration distribution of boron ion (i.e., a deeper side portion of the impurity concentration distribution with respect to the peak of the impurity concentration), and thus the peak of the interstitial silicon concentration also is not located in the tail portion. Therefore, boron ion does not diffuse into the deeper side through TED even during thermal annealing, whereby it is possible to shallow the junction plane of the P-type extension high concentration diffusion layer.

Moreover, the a/c interface is located on the substrate surface side of the impurity concentration peak A of boron ion, whereby boron ion, fluorine ion and interstitial silicon are captured by the a/c interface in the thermal annealing. Thus, there is a particular advantage that fluorine ion, which has a substantial surface proximity effect, is unlikely to flow toward the surface side, whereby it is possible to suppress the dose loss phenomenon of boron ion.

Figure 5:
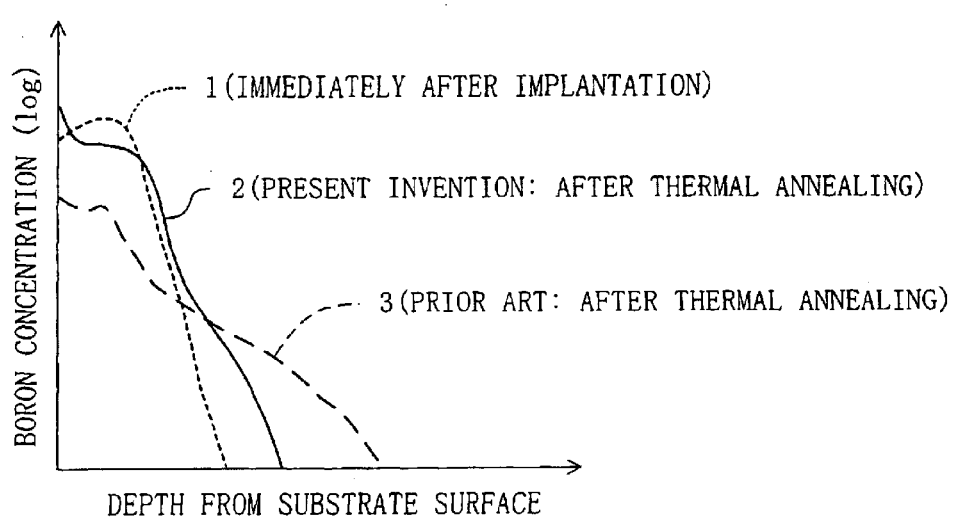
FIG. 5 is a graph illustrating the distribution of the boron ion concentration immediately after implantation of boron fluoride ion and that after thermal annealing in the method for manufacturing the MIS transistor according to the first embodiment of the present invention, with a conventional example being shown for comparison.

The impurity concentration distribution of boron ion illustrated in FIG. 5 is obtained by the diffusion and capture mechanism described above.

FIG. 5 illustrates the impurity concentration distribution of boron ion immediately after the implantation of boron fluoride ion and after the thermal annealing in the step of FIG. 2D, in comparison with a conventional example. In FIG. 5, a broken line 1 denotes the impurity concentration distribution immediately after the implantation of boron ion, peaking at a relatively shallow position from the substrate surface. A solid line 2 denotes the impurity concentration distribution of boron ion after the thermal annealing according to the present embodiment. As shown in the figure, in the first embodiment, the impurity concentration distribution generally retains its profile immediately after the implantation through the thermal annealing. In contrast, a broken line 3 denoting the impurity concentration distribution of boron ion after the thermal annealing according to the conventional example shows that boron ion diffuses into deep portions of the substrate while the concentration substantially decreases in the vicinity of the substrate surface, indicating that there is undesirable dose loss.

Moreover, according to the first embodiment, a top portion of the N-type well 11a is turned into an amorphous state before the formation of the P-type extension high concentration diffusion layer 16, thereby providing an additional effect of suppressing channeling of boron fluoride ion forming the extension layer.

Moreover, the dislocation loop defect layer 19 is provided at a position shallower than the implantation projected range of the P-type extension high concentration diffusion layer 16, and thus is spaced apart from the junction plane of the P-type extension high concentration diffusion layer 16, whereby junction leak due to the dislocation loop defect layer 19 can be suppressed.

Moreover, since the dose loss is suppressed, it is not necessary to implant an excessive dose of ion. Therefore, it is possible to reduce the damage to crystal during the ion implantation, and to improve the throughput of the ion implantation step.

Second Embodiment

A second embodiment of the present invention will now be described with reference to the drawings.

FIG. 6A to FIG. 6D and FIG. 7A to FIG. 7C are cross-sectional views sequentially illustrating steps in a method for manufacturing an MIS transistor according to the second embodiment of the present invention.

Figure 6A:
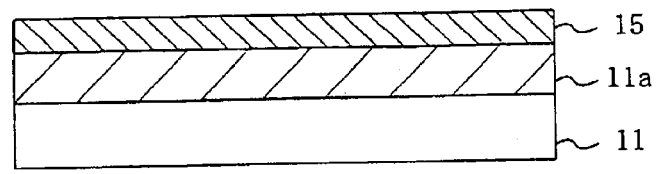
FIG. 6A to FIG. 6D are cross-sectional views sequentially illustrating steps in a method for manufacturing an MIS transistor according to a second embodiment of the present invention.

First, referring to FIG. 6A, the semiconductor substrate 11 made of P-type silicon is subjected to ion implantation at an implantation energy of about 140 keV and a dose of about $1 \times 10^{12}/cm^2$ by using N-type impurity ion, e.g., arsenic ion. Then, using N-type impurity ion, e.g., phosphorus ion, ion implantation at an implantation energy of about 260 keV and a dose of about $4 \times 10^{12}/cm^2$ is performed, and further ion implantation at an implantation energy of about 540 keV and a dose of about $1 \times 10^{13}/cm^2$ is performed. Following the ion implantation, rapid thermal annealing is performed, in which the intermediate product is heated to a high temperature of about 900° C. to about 1025° C. at a heating rate of about 100° C./sec and then held at the high temperature for about 1 second to about 10 seconds, thereby forming the N-type well 11a through diffusion of phosphorus ion in an upper portion of the semiconductor substrate 11, and the N-type channel diffusion layer 15 through diffusion of arsenic ion in an upper portion of the N-type well 11a. While arsenic ion is used herein for the N-type channel diffusion layer 15, antimony or a mixture of arsenic and antimony may alternatively be used. Note that the order in which arsenic ion and phosphorus ion are implanted is not critical.

Figure 6B:
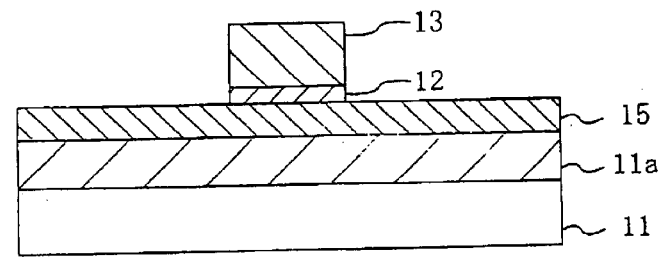

Then, referring to FIG. 6B, the gate insulative film 12 made of a thermal oxide film, or the like, and having a thickness of about 2.2 nm is formed. Then, a polycrystalline silicon film having a thickness of about 250 nm is deposited on the gate oxide film 12, and then the gate electrode 13 is selectively formed from the deposited polycrystalline silicon film. The gate electrode 13 may have a poly-metal gate structure.

Figure 6C:
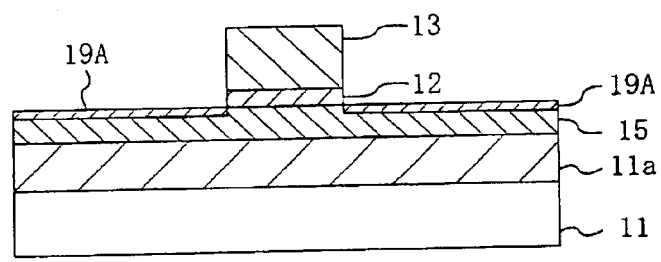

Then, referring to FIG. 6C, the N-type well 11a is subjected to silicon ion implantation at an implantation energy of about 6 keV and a dose of about $1 \times 10^{15}/cm^2$ using the gate electrode 13 as a mask, thereby forming the amorphous layer 19A of silicon having a junction plane at a very shallow position in an upper portion of the N-type channel diffusion layer 15. Germanium may alternatively be used as the element forming the amorphous layer 19A.

Figure 6D:
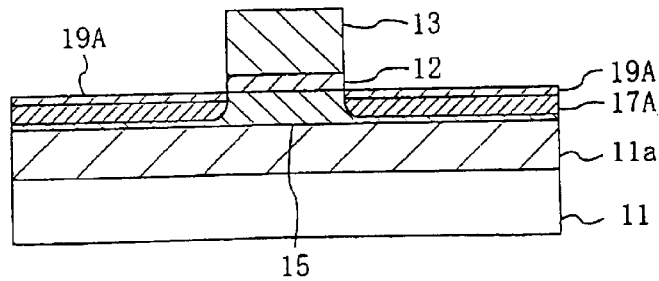

Then, referring to FIG. 6D, the N-type well 11a is subjected to ion implantation at an implantation energy of about 130 keV and a dose of about $7 \times 10^{13}/cm^2$ by using N-type impurity ion, e.g., arsenic ion, and using the gate electrode 13 as a mask, thereby forming an arsenic ion implantation layer 17A having a junction plane at a position in the N-type well 11a deeper than the a/c interface of the amorphous layer 19A.

Figure 7A:
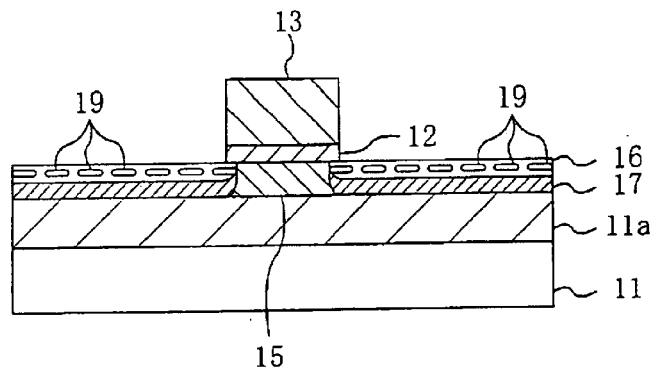
FIG. 7A to FIG. 7C are cross-sectional views sequentially illustrating steps in the method for manufacturing the MIS transistor according to the second embodiment of the present invention.

Then, referring to FIG. 7A, the N-type well 11a is subjected to five iterations of ion implantation at an implantation energy of about 10 keV and a dose of about $6 \times 10^{13}/cm^2$ by using a P-type impurity ion, e.g., boron fluoride ion, and using the gate electrode 13 as a mask. The implantation projected range of boron fluoride ion is preferably about 14 nm or less. After each iteration of ion implantation, rapid thermal annealing is performed, in which the intermediate product is heated to a high temperature of about 900° C. to about 1050° C. at a heating rate of about 100° C./sec and then held at the high temperature for up to about 10 seconds. Thus, the dislocation loop defect layer 19 is formed in the N-type well 11a below the a/c interface of the amorphous layer 19A. At the same time, boron ion diffuses, thereby forming the P-type extension high concentration diffusion layer 16 having a junction plane at a position deeper than the dislocation loop defect layer 19, and arsenic ion diffuses from the arsenic ion implantation layer 17A, thereby forming the N-type pocket diffusion layer 17 under the high concentration diffusion layer 16.

Also in the second embodiment, the order in which arsenic ion forming the N-type pocket diffusion layer 17 and boron fluoride ion forming the P-type extension high concentration diffusion layer 16 are implanted is not critical. Moreover, the provision of the N-type pocket diffusion layer 17 may be optional.

Figure 7B:
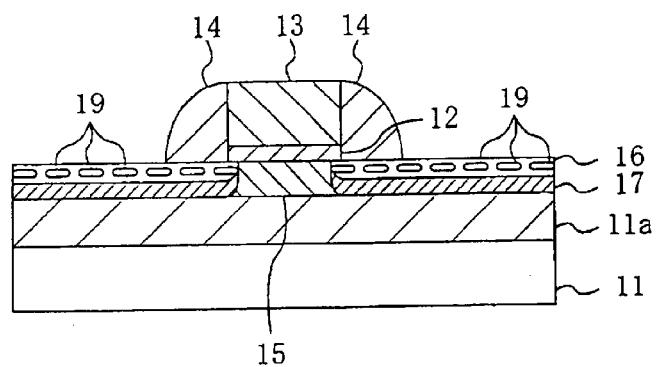

Then, referring to FIG. 7B, an insulative film made of silicon nitride having a thickness of about 50 nm, for example, is deposited by CVD across the entire surface of the semiconductor substrate 11 including the gate electrode 13, and then the deposited insulative film is subjected to selective etching having a strong anisotropy in a direction perpendicular to the substrate plane, thereby forming the side wall 14 made of the insulative film on the side surface of the gate electrode 13.

Figure 7C:
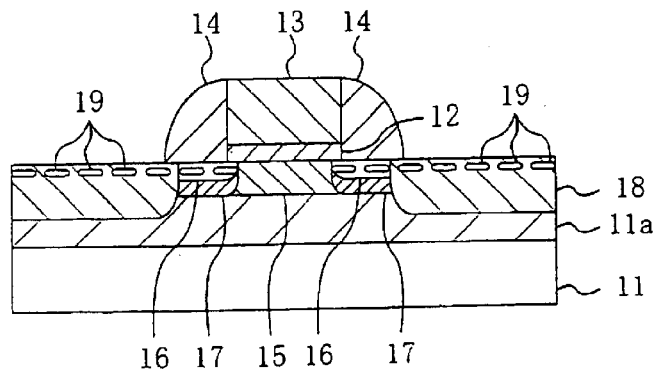

Then, referring to FIG. 7C, the N-type well 11a is subjected to ion implantation at an implantation energy of about 30 keV and a dose of about $3 \times 10^{15}/cm^2$ by using P-type impurity ion, e.g., boron fluoride ion, and using the gate electrode 13 and the side wall 14 as a mask. Following the ion implantation, rapid thermal annealing is performed in which the intermediate product is heated to a high temperature of about 1000° C. to about 1050° C. at a heating rate of about 100° C./sec and then held at the high temperature for up to about 10 seconds, thereby forming the P-type high concentration diffusion layer 18 in a source-drain formation region on the outer side of the P-type extension high concentration diffusion layer 16. The P-type high concentration diffusion layer 18 is formed through diffusion of boron ion and has a junction plane at a position deeper than the P-type extension high concentration diffusion layer 16.

As described above, in the second embodiment, the implantation step for the extension layer illustrated in FIG. 7A is performed through five iterations of boron fluoride ion implantation each at a low dose, each iteration of ion implantation being followed by thermal annealing so as to restore the crystallinity of the semiconductor substrate 11. In this way, it is possible to prevent the a/c interface of the shallow amorphous layer 19A formed by implantation of silicon ion from moving deeper in the semiconductor substrate 11. As a result, it is possible to prevent the peak position of the interstitial silicon illustrated in FIG. 4 from passing beyond the impurity concentration peak A of boron ion, whereby the shallow junction of the P-type extension high concentration diffusion layer 16 can be reliably maintained while the dose loss phenomenon of boron ion and fluorine ion can be reliably suppressed.

Note that the plurality of iterations of boron fluoride implantation are preferably performed each with a dose such that the N-type well 11a is not turned into an amorphous state.

Moreover, it is preferred that the exposed surface of the semiconductor substrate 11 is covered by an insulative film before the rapid thermal annealing is performed in the step of FIG. 7A and after the formation of the gate electrode 13. In this way, it is possible to more reliably prevent the dose loss of boron ion. Specifically, a silicon nitride film having a thickness of about 2 nm, for example, is deposited by low pressure CVD, or the like, and then boron fluoride ion is implanted via the silicon nitride film. Note that the silicon nitride film is preferably removed after the thermal annealing.

Moreover, in the first or second embodiment, impurity ion forming the P-type extension high concentration diffusion layer 16 is not limited to boron fluoride, but may alternatively be a molecule containing fluorine, e.g., $BF_3$.

Third Embodiment

A third embodiment of the present invention will now be described with reference to the drawings.

FIG. 8A to FIG. 8D, FIG. 9A and FIG. 9B are cross-sectional views sequentially illustrating steps in a method for manufacturing an MIS transistor according to the third embodiment of the present invention.

Figure 8A:
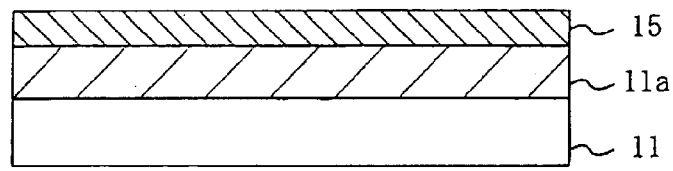
FIG. 8A to FIG. 8D are cross-sectional views sequentially illustrating steps in a method for manufacturing an MIS transistor according to a third embodiment of the present invention.

First, referring to FIG. 8A, the semiconductor substrate 11 made of P-type silicon is subjected to ion implantation at an implantation energy of about 140 keV and a dose of about $1 \times 10^{12}/cm^2$ by using N-type impurity ion, e.g., arsenic (As) ion. Then, using N-type impurity ion, e.g., phosphorus (P) ion, ion implantation at an implantation energy of about 260 keV and a dose of about $4 \times 10^{12}/cm^2$ is performed, and further ion implantation at an implantation energy of about 540 keV and a dose of about $1 \times 10^{13}/cm^2$ is performed. Following the ion implantation, rapid thermal annealing is performed, in which the intermediate product is heated to a high temperature of about 900° C. to about 1025° C. at a heating rate of about 100° C./sec and then held at the high temperature for about 1 second to about 10 seconds, thereby forming the N-type well 11$a$ through diffusion of phosphorus ion in an upper portion of the semiconductor substrate 11, and the N-type channel diffusion layer 15 through diffusion of arsenic ion in an upper portion of the N-type well 11$a$. While arsenic ion is used herein for the N-type channel diffusion layer 15, antimony or a mixture of arsenic and antimony may alternatively be used. Note that the order in which arsenic ion and phosphorus ion are implanted is not critical.

Figure 8B:
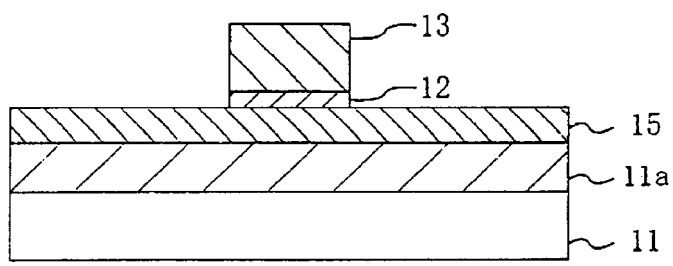

Then, referring to FIG. 8B, the gate insulative film 12 made of a thermal oxide film, or the like, and having a thickness of about 2.2 nm is formed. Then, a polycrystalline silicon film having a thickness of about 250 nm is deposited by CVD, or the like, on the gate oxide film 12, and then the gate electrode 13 is selectively formed from the deposited polycrystalline silicon film. The gate electrode 13 may have a poly-metal gate structure.

Figure 8C:
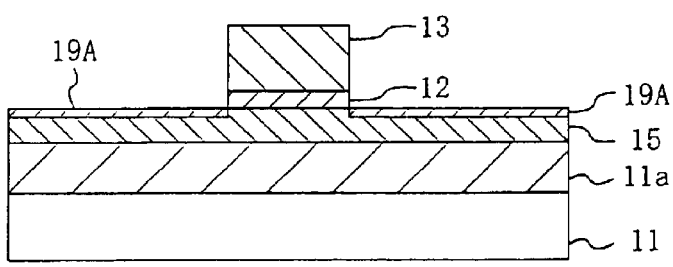

Then, referring to FIG. 8C, the N-type well 11$a$ is subjected to ion implantation at an implantation energy of about 6 keV and a dose of about $1 \times 10^{15}/cm^2$ by using a group IV element, e.g., silicon, and using the gate electrode 13 as a mask, thereby forming an amorphous layer 19A of silicon having a junction plane at a very shallow position in an upper portion of the N-type channel diffusion layer 15. Germanium (Ge) may alternatively be used as the group IV element forming the amorphous layer 19A.

Figure 8D:
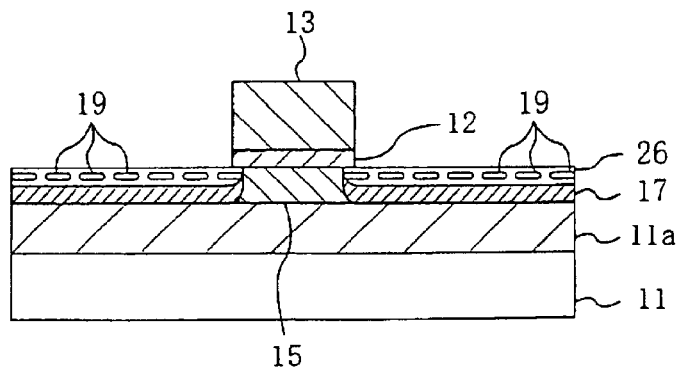

Then, referring to FIG. 8D, the N-type well 11$a$ is subjected to ion implantation at an implantation energy of about 130 keV and a dose of about $7 \times 10^{13}/cm^2$ by using N-type impurity ion, e.g., arsenic ion, and using the gate electrode 13 again as a mask. Then, further ion implantation is performed at an implantation energy of about 2 keV and a dose of about $3 \times 10^{14}/cm^2$ by using P-type impurity ion, e.g., boron ion ($B^+$). The implantation projected range of boron ion is preferably about 14 nm or less. Following the ion implantation, rapid thermal annealing is performed, in which the intermediate product is heated to a high temperature of about 900° C. to about 1050° C. at a heating rate of about 100° C./sec and then held at the high temperature for up to about 10 seconds, thereby forming the dislocation loop defect layer 19 in the N-type well 11$a$ below the a/c interface of the amorphous layer 19A. At the same time, boron ion diffuses, thereby forming a P-type extension high concentration diffusion layer 26 having a junction plane at a position deeper than the dislocation loop defect layer 19, and arsenic ion diffuses, thereby forming the N-type pocket diffusion layer 17 under the high concentration diffusion layer 26.

Note that the order in which arsenic ion and boron ion are implanted is not critical. Moreover, the implantation of arsenic ion may be optional, and therefore the provision of the N-type pocket diffusion layer 17 may be optional. Furthermore, the rapid thermal annealing in this step may be omitted.

Figure 9A:
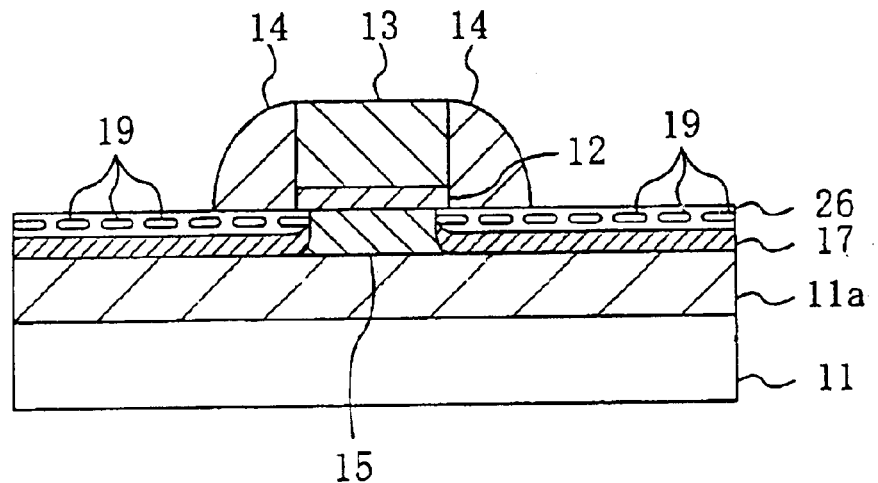
FIG. 9A and FIG. 9B are cross-sectional views sequentially illustrating steps in the method for manufacturing the MIS transistor according to the third embodiment of the present invention.

Then, referring to FIG. 9A, an insulative film made of silicon nitride having a thickness of about 50 nm, for example, is deposited by CVD, or the like, across the entire surface of the semiconductor substrate 11 including the gate electrode 13, and then the deposited insulative film is subjected to selective etching having a strong anisotropy in a direction perpendicular to the substrate plane, thereby forming the side wall 14 made of the insulative film on the side surface of the gate electrode 13.

Figure 9B:
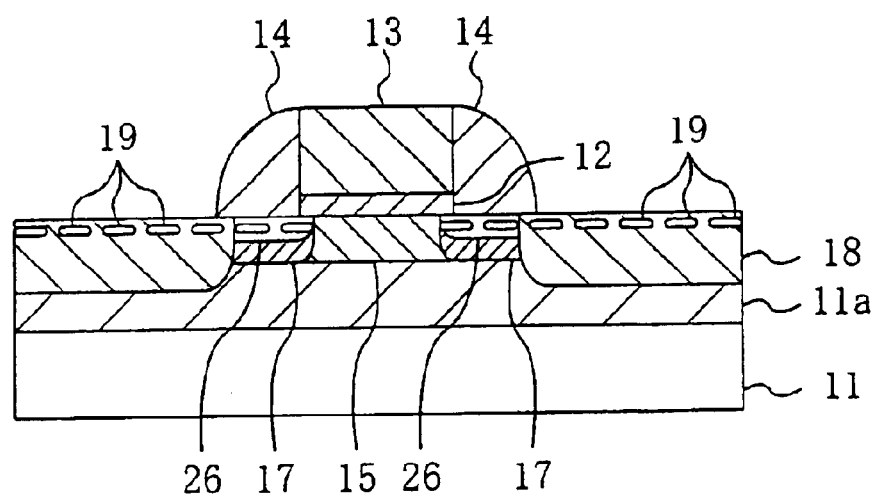

Then, referring to FIG. 9B, the N-type well 11$a$ is subjected to ion implantation at an implantation energy of about 30 keV and a dose of about $3 \times 10^5/cm^2$ by using P-type impurity ion, e.g., boron fluoride ion, and using the gate electrode 13 and the side wall 14 as a mask. Following the ion implantation, rapid thermal annealing is performed, in which the intermediate product is heated to a high temperature of about 1000° C. to about 1050° C. at a heating rate of about 100° C./sec and then held at the high temperature for up to about 10 seconds, thereby forming the P-type high concentration diffusion layer 18 in a source-drain formation region on the outer side of the P-type extension high concentration diffusion layer 26. The P-type high concentration diffusion layer 18 is formed through diffusion of boron ion and has a junction plane at a position deeper than the P-type extension high concentration diffusion layer 26.

Note that it is preferred that the exposed surface of the semiconductor substrate 11 is covered by an insulative film before the rapid thermal annealing is performed in the step of FIG. 8D and after the formation of the gate electrode 13. In this way, it is possible to more reliably prevent the dose loss of boron ion. Specifically, a silicon nitride film having a thickness of about 2 nm, for example, is deposited by low pressure CVD, or the like, and then boron ion is implanted via the silicon nitride film. Note that the silicon nitride film is preferably removed after the thermal annealing.

In the third embodiment, as in the first and second embodiments, silicon ion is implanted at a low energy and a high dose, followed by thermal annealing, as illustrated in FIG. 8C, before implanting boron for forming the P-type extension high concentration diffusion layer 26, thereby forming the dislocation loop defect layer 19 at a very shallow position, as illustrated in FIG. 8D.

Figure 10:
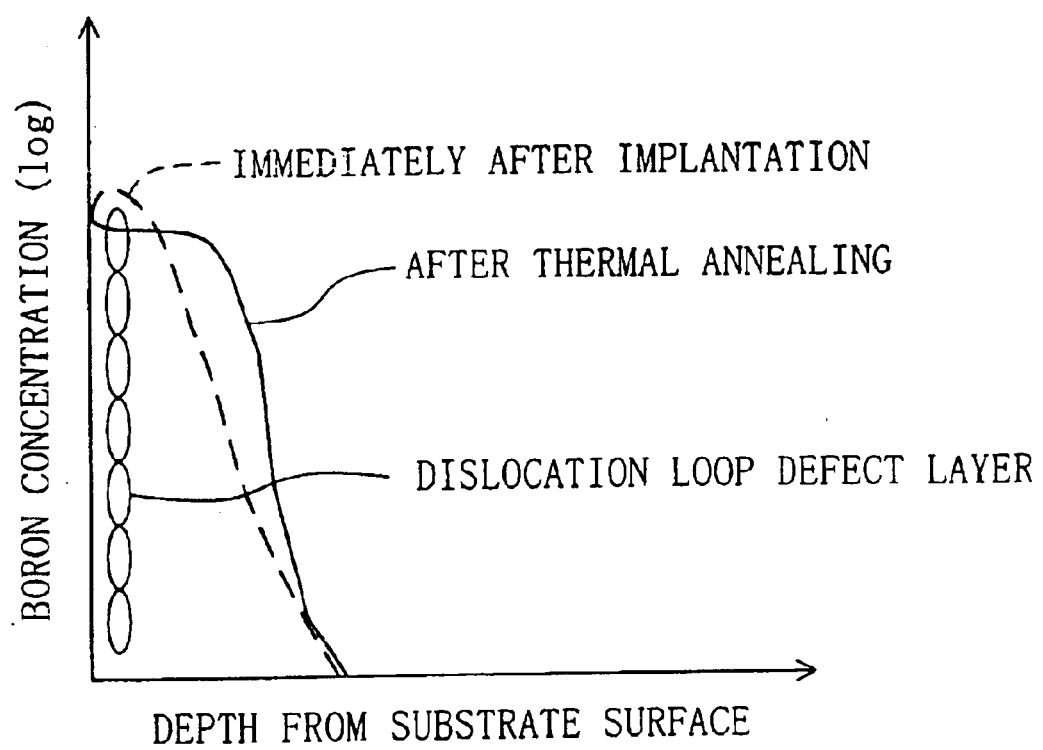
FIG. 10 is a graph illustrating the position of a dislocation loop defect layer from the substrate surface, and the boron concentration distribution immediately after implantation and that after annealing, in the MIS transistor according to the third embodiment of the present invention.

FIG. 10 illustrates the dislocation loop defect layer, and the boron ion concentration distribution immediately after the implantation and that after annealing, in the MIS transistor according to the third embodiment. In FIG. 10, the horizontal axis of the graph represents the depth from the substrate surface, and the vertical axis represents the logarithmic value of the boron concentration. As illustrated in FIG. 10, since the dislocation loop defect layer is formed at a shallow position in the substrate, the dislocation loop defect layer captures interstitial silicon, thereby suppressing TED of boron. Moreover, since the concentration of excessive interstitial silicon existing in the vicinity of a high concentration region in the boron implantation is reduced, the boron clustering reaction due to the interaction between boron and interstitial silicon is suppressed. As a result, it is possible to prevent the boron activation concentration from decreasing.

Moreover, by forming the dislocation loop defect layer 19 at a shallow position in the semiconductor substrate 11, the boron diffusion from the inside of the substrate toward the surface thereof is suppressed, whereby it is possible to prevent the dose loss of boron.

Moreover, since the dislocation loop defect layer 19 is spaced apart from the P-type extension high concentration diffusion layer 26, junction leak due to the dislocation loop defect layer 19 can also be suppressed.

In addition, the semiconductor substrate 11 is turned into an amorphous state before the implantation of boron ion for forming the P-type extension high concentration diffusion layer 26, thereby providing an additional effect of suppressing channeling of boron ion.

As described above, according to the third embodiment, the activation efficiency of boron in the P-type extension high concentration diffusion layer 26 is improved, and the dose loss is suppressed, whereby it is not necessary to implant an excessive dose of ion. Therefore, the damage to crystal during the ion implantation is reduced, whereby even when boron whose mass number is small is used as the P-type impurity, TED of boron is suppressed. Therefore, it is possible to reliably form the junction of the P-type high concentration impurity layer at a shallow position.

Fourth Embodiment

A fourth embodiment of the present invention will now be described with reference to the drawings.

FIG. 11A to FIG. 11D and FIG. 12A to FIG. 12C are cross-sectional views sequentially illustrating steps in a method for manufacturing an MIS transistor according to the fourth embodiment of the present invention.

Figure 11A:
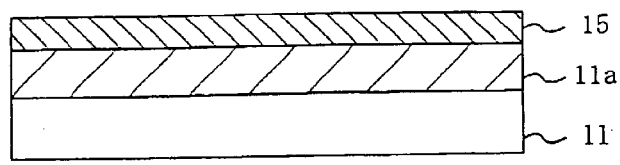
FIG. 11A to FIG. 11D are cross-sectional views sequentially illustrating steps in a method for manufacturing an MIS transistor according to a fourth embodiment of the present invention.

First, referring to FIG. 11A, the semiconductor substrate 11 made of P-type silicon is subjected to ion implantation at an implantation energy of about 140 keV and a dose of about $1\times10^{12}/cm^2$ by using N-type impurity ion, e.g., arsenic ion. Then, using N-type impurity ion, e.g., phosphorus ion, ion implantation at an implantation energy of about 260 keV and a dose of about $4\times10^{12}/cm^2$ is performed, and further ion implantation at an implantation energy of about 540 keV and a dose of about $1\times10^{13}/cm^2$ is performed. Following the ion implantation, rapid thermal annealing is performed, in which the intermediate product is heated to a high temperature of about 900° C. to about 1025° C. at a heating rate of about 100° C./sec and then held at the high temperature for about 1 second to about 10 seconds, thereby forming the N-type well 11a through diffusion of phosphorus ion in an upper portion of the semiconductor substrate 11, and the N-type channel diffusion layer 15 through diffusion of arsenic ion in an upper portion of the N-type well 11a. While arsenic ion is used herein for the N-type channel diffusion layer 15, antimony or a mixture of arsenic and antimony may alternatively be used. Note that the order in which arsenic ion and phosphorus ion are implanted is not critical.

Figure 11B:
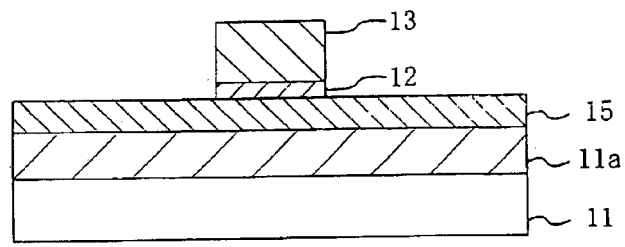
Figure 11C:
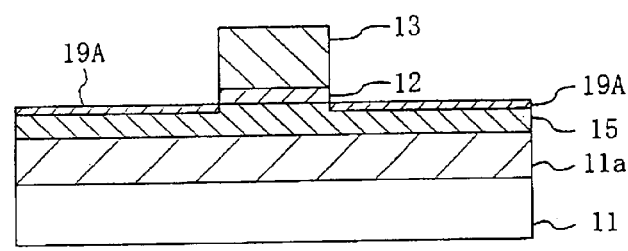
Figure 11D:
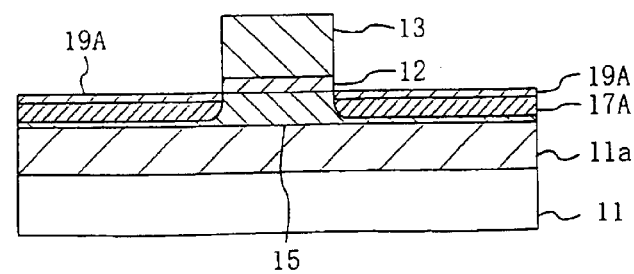

Then, referring to FIG. 11B, the gate insulative film 12 made of a thermal oxide film, or the like, and having a thickness of about 2.2 nm is formed. Then, a polycrystalline silicon film having a thickness of about 250 nm is deposited on the gate oxide film 12, and then the gate electrode 13 is formed from the deposited polycrystalline silicon film. The gate electrode 13 may have a poly-metal gate structure.

Then, referring to FIG. 1C, the N-type well 11a is subjected to ion implantation at an implantation energy of about 6 keV and a dose of about $1\times10^{15}/cm^2$ using the gate electrode 13 as a mask, thereby forming the amorphous layer 19A of silicon having a junction plane at a very shallow position in an upper portion of the N-type channel diffusion layer 15. Germanium may alternatively be used as the element forming the amorphous layer 19A.

Then, referring to FIG. 1D, the N-type well 11a is subjected to ion implantation at an implantation energy of about 130 keV and a dose of about $7\times10^{13}/cm^2$ by using N-type impurity ion, e.g., arsenic ion, and using the gate electrode 13 as a mask, thereby forming the arsenic ion implantation layer 17A having a junction plane at a position in the N-type well 11a deeper than the a/c interface of the amorphous layer 19A.

Figure 12A:
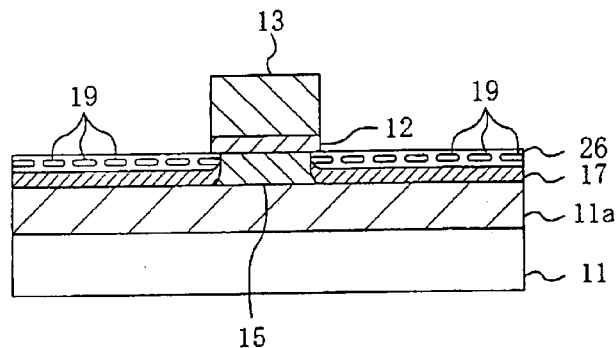
FIG. 12A to FIG. 12C are cross-sectional views sequentially illustrating steps in the method for manufacturing the MIS transistor according to the fourth embodiment of the present invention.

Then, referring to FIG. 12A, the N-type well 11a is subjected to five iterations of ion implantation at an implantation energy of about 2 keV and a dose of about $6\times10^{13}/cm^2$ by using a P-type impurity ion, e.g., boron ion, and using the gate electrode 13 as a mask. The implantation projected range of boron ion is preferably about 14 nm or less. After each iteration of ion implantation, rapid thermal annealing is performed, in which the intermediate product is heated to a high temperature of about 900° C. to about 1050° C. at a heating rate of about 100° C./sec and then held at the high temperature for up to about 10 seconds. Thus, the dislocation loop defect layer 19 is formed in the N-type well 11a below the a/c interface of the amorphous layer 19A. At the same time, boron ion diffuses, thereby forming the P-type extension high concentration diffusion layer 26 having a junction plane at a position deeper than the dislocation loop defect layer 19, and arsenic ion diffuses from the arsenic ion implantation layer 17A, thereby forming the N-type pocket diffusion layer 17 under the high concentration diffusion layer 26.

Also in the fourth embodiment, the order in which arsenic ion forming the N-type pocket diffusion layer 17 and boron ion forming the P-type extension high concentration diffusion layer 26 are implanted is not critical. Moreover, the provision of the N-type pocket diffusion layer 17 may be optional.

Figure 12B:
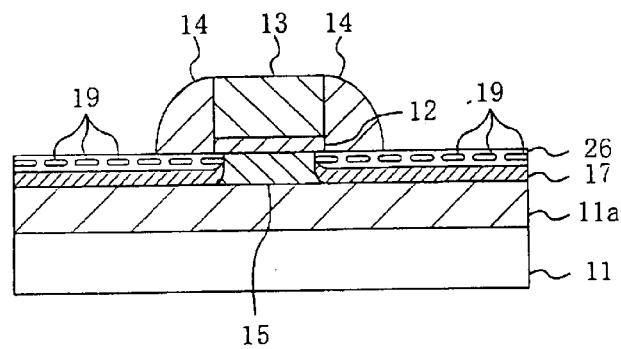

Then, referring to FIG. 12B, an insulative film made of silicon nitride having a thickness of about 50 nm, for example, is deposited by CVD across the entire surface of the semiconductor substrate 11 including the gate electrode 13, and then the deposited insulative film is subjected to selective etching having a strong anisotropy in a direction perpendicular to the substrate plane, thereby forming the side wall 14 made of the insulative film on the side surface of the gate electrode 13.

Figure 12C:
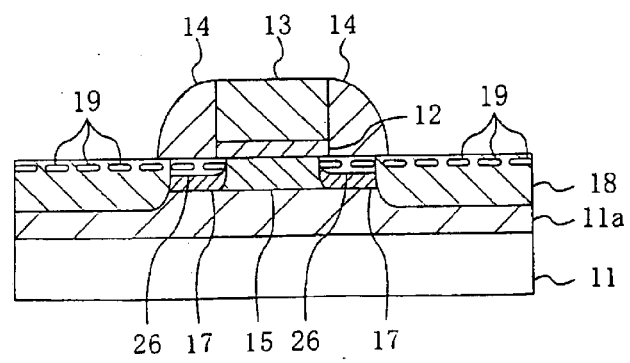
Figure 13A:
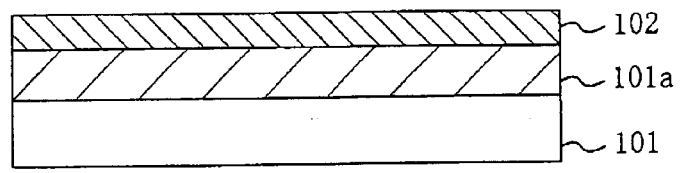
FIG. 13A to FIG. 13C are cross-sectional views sequentially illustrating steps in a conventional method for manufacturing an MIS transistor.
Figure 13B:
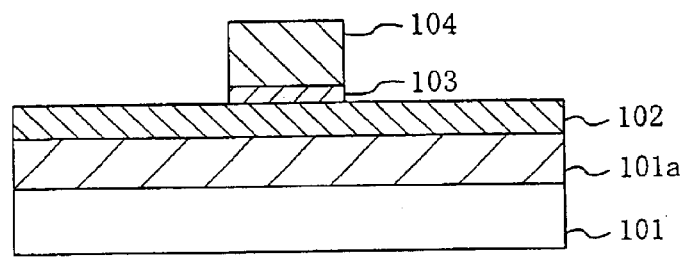
Figure 13C:
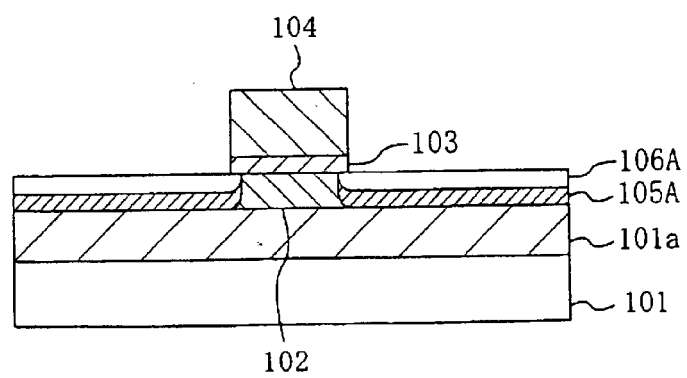
Figure 14A:
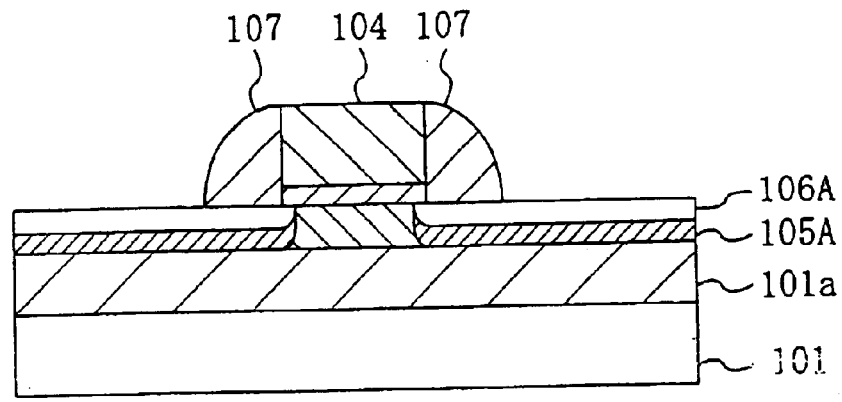
FIG. 14A and FIG. 14B are cross-sectional views sequentially illustrating steps in the conventional method for manufacturing an MIS transistor.
Figure 14B:
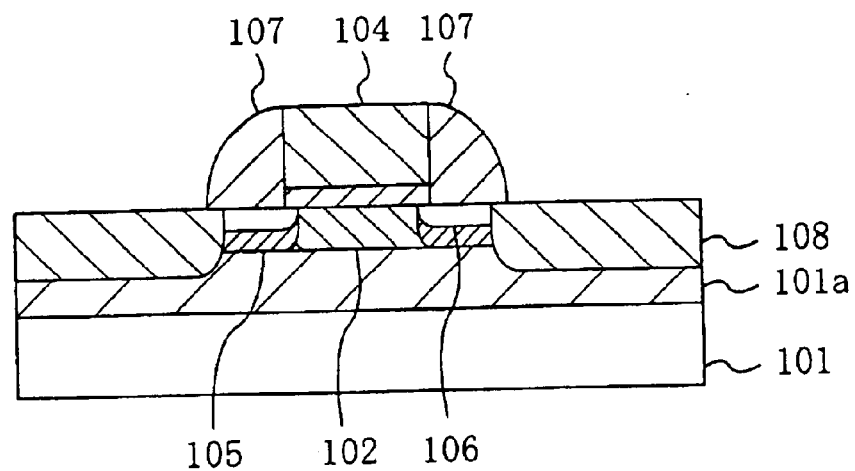
Figure 15:
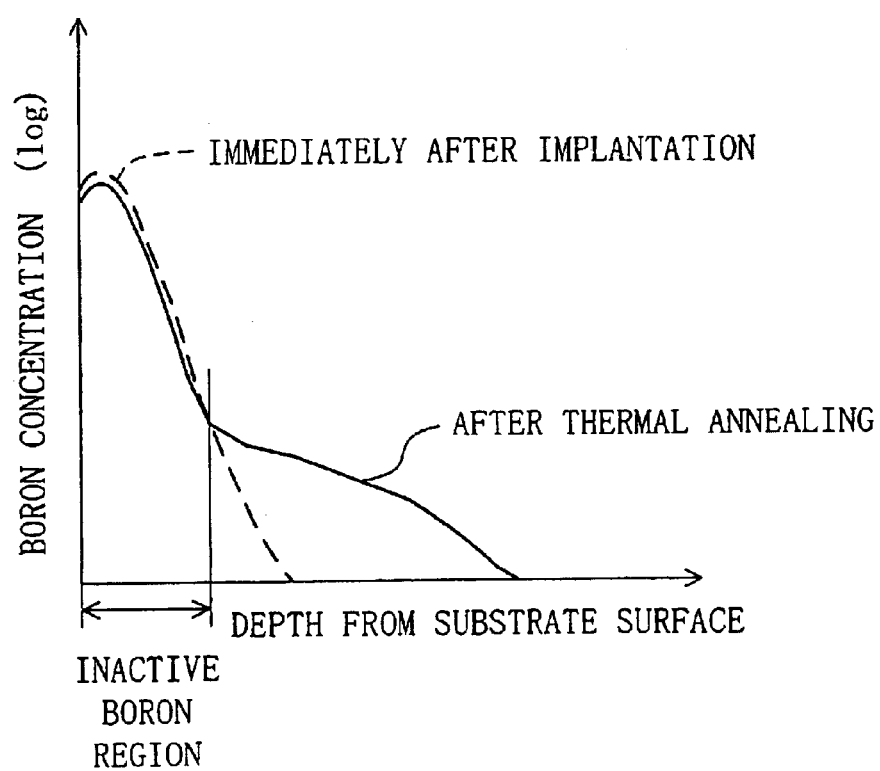
FIG. 15 is a graph illustrating the boron concentration distribution immediately after implantation and that after annealing in the conventional MIS transistor.

Then, referring to FIG. 12C, the N-type well 11a is subjected to ion implantation at an implantation energy of about 30 keV and a dose of about $3\times10^{15}/cm^2$ by using P-type impurity ion, e.g., boron fluoride ion, and using the gate electrode 13 and the side wall 14 as a mask. Following the ion implantation, rapid thermal annealing is performed, in which the intermediate product is heated to a high temperature of about 1000° C. to about 1050° C. at a heating rate of about 100° C./sec and then held at the high temperature for up to about 10 seconds, thereby forming the P-type high concentration diffusion layer 18 in a source-drain formation region on the outer side of the P-type extension high concentration diffusion layer 26. The P-type high concentration diffusion layer 18 is formed through diffusion of boron ion and has a junction plane at a position deeper than the P-type extension high concentration diffusion layer 26.

As described above, in the fourth embodiment, the implantation step for the extension layer illustrated in FIG. 12A is performed through five iterations of boron ion implantation each at a low dose, each iteration of ion implantation being followed by thermal annealing so as to restore the crystallinity of the semiconductor substrate 11. In this way, it is possible to prevent the a/c interface of the shallow amorphous layer 19A formed by implantation of silicon ion from moving deeper in the semiconductor substrate 11. As a result, the shallow junction of the P-type extension high concentration diffusion layer 26 can be reliably maintained while the dose loss phenomenon of boron ion can be reliably suppressed.

Note that the plurality of iterations of boron implantation are preferably performed each with a dose such that the N-type well 11a is not turned into an amorphous state.

Moreover, it is preferred that the exposed surface of the semiconductor substrate 11 is covered by an insulative film before the rapid thermal annealing is performed in the step of FIG. 12A and after the formation of the gate electrode 13. In this way, it is possible to more reliably prevent the dose loss of boron ion. Specifically, a silicon nitride film having a thickness of about 2 nm, for example, is deposited by low pressure CVD, or the like, and then boron ion is implanted via the silicon nitride film. Note that the silicon nitride film is preferably removed after the thermal annealing.

Note that in the first to fourth embodiments, boron may be used instead of boron fluoride as impurity ion forming the P-type high concentration diffusion layer 18, which is a source-drain diffusion layer. In a case where boron is used, the ion implantation is preferably performed at an implantation energy of about 5 keV and a dose of about $3\times10^{15}/cm^2$.

Moreover, while the first to fourth embodiments have been described above with respect to a P-type MIS transistor, the MIS transistor may be an N-type MIS transistor. For example, effects as those described above can be obtained when arsenic (As) or antimony (Sb) is used as the impurity ion forming an N-type extension high concentration diffusion layer.

What is claimed is:

1. A method for manufacturing a semiconductor device, comprising:

a first step of forming a gate electrode on a semiconductor region via a gate insulative film;

a second step of forming an amorphous layer in an upper portion of the semiconductor region by implanting ion of a group IV element into the semiconductor region using the gate electrode as a mask;

after the second step, a third step of implanting a first impurity of a first conductivity type into the semiconductor region in which the amorphous layer is formed using the gate electrode as a mask with an implantation projected range such that the first impurity reaches a position deeper than the amorphous layer; and after the third step, a fourth step of subjecting the upper portion of the semiconductor region to thermal annealing so as to form a dislocation loop defect layer and an extension high concentration diffusion layer of the first conductivity type through diffusion of the first impurity, the extension high concentration diffusion layer having a junction at a position deeper than the dislocation loop defect layer.

2. The method for manufacturing a semiconductor device of claim 1, wherein:

the third step includes a step of implanting a second impurity of a second conductivity type into the semiconductor region using the gate electrode as a mask with an implantation projected range such that the second impurity reaches a position deeper than the amorphous layer; and the fourth step includes a step of forming a pocket diffusion layer of the second conductivity type through diffusion of the second impurity under the extension high concentration diffusion layer.

3. The method for manufacturing a semiconductor device of claim 1, further comprising, after the fourth step:

a step of forming a side wall made of an insulative film on a side surface of the gate electrode; and a step of implanting a third impurity of the first conductivity type into the semiconductor region using the gate electrode and the side wall as a mask, and then performing thermal annealing, so as to form a high concentration diffusion layer of the first conductivity type through diffusion of the third impurity, the high concentration diffusion layer of the first conductivity type being located on an outer side of the extension high concentration diffusion layer and having a junction plane at a position deeper than the extension high concentration diffusion layer.

4. The method for manufacturing a semiconductor device of claim 1, wherein the group IV element is silicon or germanium.

5. The method for manufacturing a semiconductor device of claim 1, wherein the second step includes implanting ion of the group IV element at a dose equal to or greater than a dose such that the semiconductor region is turned into an amorphous state.

6. The method for manufacturing a semiconductor device of claim 1, wherein the third step includes implanting the second impurity with an implantation projected range of about 14 nm or less.

7. The method for manufacturing a semiconductor device of claim 1, wherein the second impurity is a molecule containing boron fluoride or fluorine.

8. The method for manufacturing a semiconductor device of claim 1, wherein the second impurity is boron.

9. The method for manufacturing a semiconductor device of claim 1, wherein the third step includes a step of performing a plurality of iterations of ion implantation of the first impurity each at a dose less than or equal to a dose such that the semiconductor region is turned into an amorphous state, each of the iterations of ion implantation being followed by thermal annealing so as to restore a crystallinity of the semiconductor region.

10. The method for manufacturing a semiconductor device of claim 1, further comprising, between the first step and the third step, a step of forming an insulative film on the semiconductor region so as to cover an exposed portion of the semiconductor region.

* * * * *